United States Patent
Jeong et al.

(10) Patent No.: US 11,454,879 B2
(45) Date of Patent: Sep. 27, 2022

(54) MASK TREATING METHOD

(71) Applicant: Samsung Electronics Co., Ltd., Suwon-si (KR)

(72) Inventors: Yunsong Jeong, Yongin-si (KR); Hyunseok Uhm, Hwaseong-si (KR); SunPyo Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 325 days.

(21) Appl. No.: 16/801,328

(22) Filed: Feb. 26, 2020

(65) Prior Publication Data

US 2020/0192214 A1    Jun. 18, 2020

Related U.S. Application Data

(63) Continuation of application No. 15/837,512, filed on Dec. 11, 2017, now Pat. No. 10,613,432.

(30) Foreign Application Priority Data

Dec. 20, 2016    (KR) .................. 10-2016-0174834

(51) Int. Cl.
*G03F 1/42*    (2012.01)
*G03F 1/60*    (2012.01)
*G03F 1/82*    (2012.01)

(52) U.S. Cl.
CPC .................. *G03F 1/42* (2013.01); *G03F 1/60* (2013.01); *G03F 1/82* (2013.01)

(58) Field of Classification Search
CPC ..... G03F 1/42; G03F 1/60; G03F 1/82; G03F 1/66; G03F 7/70025; G03F 7/70683
See application file for complete search history.

(56) References Cited

U.S. PATENT DOCUMENTS

| | | | | |
|---|---|---|---|---|
| 5,948,466 A | * | 9/1999 | Sarashina | B41N 1/248 427/256 |
| 5,966,307 A | * | 10/1999 | Lin | G05B 19/18 33/12 |
| 6,198,527 B1 | * | 3/2001 | Nishi | G03F 7/70691 355/53 |
| 6,327,021 B1 | | 12/2001 | Higashiguchi | |
| 6,417,484 B1 | | 7/2002 | Canella et al. | |
| 6,765,673 B1 | | 7/2004 | Higashikawa | |
| 6,930,276 B2 | | 8/2005 | Nepomuceno et al. | |
| 7,927,766 B2 | | 4/2011 | Barrett et al. | |
| 8,021,804 B2 | | 9/2011 | Okubo et al. | |
| 8,512,918 B2 | | 8/2013 | Shoki | |
| 9,195,131 B2 | | 11/2015 | Orihara et al. | |
| 9,244,341 B2 | | 1/2016 | Lee et al. | |

(Continued)

FOREIGN PATENT DOCUMENTS

KR    10-2010-0037799 A    4/2010

*Primary Examiner* — Geoffrey S Evans
(74) *Attorney, Agent, or Firm* — Muir Patent Law, PLLC

(57) ABSTRACT

Disclosed are a mask treating apparatus and a mask treating method. The mask treating apparatus comprises a process chamber that receives a blank mask package inclusive of a blank mask and performs a process on the blank mask, an unpacking unit that is disposed in the process chamber and unpacks the blank mask package, and a laser marking unit that is disposed in the process chamber and irradiates a laser onto the blank mask to form a fiducial mark.

19 Claims, 12 Drawing Sheets

(56) References Cited

U.S. PATENT DOCUMENTS

| | | |
|---|---|---|
| 9,268,207 B2 | 2/2016 | Ikuta |
| 2004/0090605 A1 | 5/2004 | Yogev |
| 2005/0006266 A1* | 1/2005 | Kurikawa ................ G03F 1/66 430/4 |
| 2005/0051881 A1* | 3/2005 | Chen .................... H01L 23/544 257/E23.179 |
| 2005/0084767 A1* | 4/2005 | Zait .......................... G03F 1/72 430/311 |
| 2006/0159931 A1* | 7/2006 | Suzuki .................... G03F 1/60 428/428 |
| 2006/0223417 A1 | 10/2006 | Sattelberger et al. |
| 2009/0162758 A1 | 6/2009 | Ikenaga |
| 2012/0288989 A1 | 11/2012 | Huang |
| 2013/0078555 A1* | 3/2013 | Orihara ................... G03F 1/60 430/5 |
| 2015/0165549 A1* | 6/2015 | Beutler ............... B23K 26/032 219/121.83 |
| 2015/0198874 A1 | 7/2015 | Ikuta |
| 2016/0004153 A1* | 1/2016 | Shoki ................... G06T 7/0004 204/192.13 |

* cited by examiner

MASK TREATING METHOD

CROSS-REFERENCE TO RELATED APPLICATIONS

This U.S. nonprovisional patent application is a continuation of U.S. patent application Ser. No. 15/837,512, filed Dec. 11, 2017, in the U.S. Patent and Trademark Office, which claims the benefit of priority under 35 U.S.C § 119 of Korean Patent Application No. 10-2016-0174834, filed on Dec. 20, 2016, in the Korean Intellectual Property Office, the entire contents of which are hereby incorporated by reference.

BACKGROUND

The present disclosure relates to a mask treating apparatus and a mask treating method, and more particularly to, a mask treating apparatus and a mask treating method in which a fiducial mark is formed on a blank mask.

Photolithography is used to form fine patterns in fabricating a semiconductor device. A transfer mask (e.g., a photomask) may be employed to form the fine patterns. The fabrication of the transfer mask may use a blank mask having a thin layer for forming a transfer pattern (or, a mask pattern) on a transparent substrate.

SUMMARY

Embodiments of the present disclosure provide a mask treating apparatus and a mask treating method in which a fiducial mark can be formed without requiring separate processes and/or facility.

In some exemplary embodiments, the disclosure is directed to a mask treating apparatus comprising: a process chamber configured to receive a blank mask package including a blank mask and perform a process on the blank mask; an unpacking unit that is disposed in the process chamber and configured to unpack the blank mask package; and a laser marking unit that is disposed in the process chamber and configured to irradiate a laser onto the blank mask to form a fiducial mark.

In some exemplary embodiments, the disclosure is directed to a mask treating method comprising: providing a blank mask package that includes a blank mask; unpacking the blank mask package to provide the blank mask; and creating on the blank mask a fiducial mark serving as a reference point to determine a defect position on the blank mask, wherein creating the fiducial mark comprises: selecting one of a first mode and a second mode based on an uppermost layer of the blank mask; irradiating a laser onto a first side of the blank mask to form the fiducial mark under the first mode; and reversing the blank mask upside down and then irradiating the laser onto a second side of the blank mask to form the fiducial mark under the second mode.

In some exemplary embodiments, the disclosure is directed to a mask treating method comprising: creating, during an unpacking process of a blank mask package including a blank mask, fiducial mark on the blank mask, wherein the fiducial mark serves as a reference point to determine a defect position on the blank mask, wherein creating the fiducial mark comprises: determining a constituent of an uppermost layer of the blank mask; selecting one of a first mode and a second mode based on the constituent of the uppermost layer; irradiating a laser onto a first side of the blank mask to form the fiducial mark under the first mode; and reversing the blank mask and irradiating the laser onto a second side of the blank mask to form the fiducial mark under the second mode.

DETAILED DESCRIPTION OF EMBODIMENTS

Figure 1:
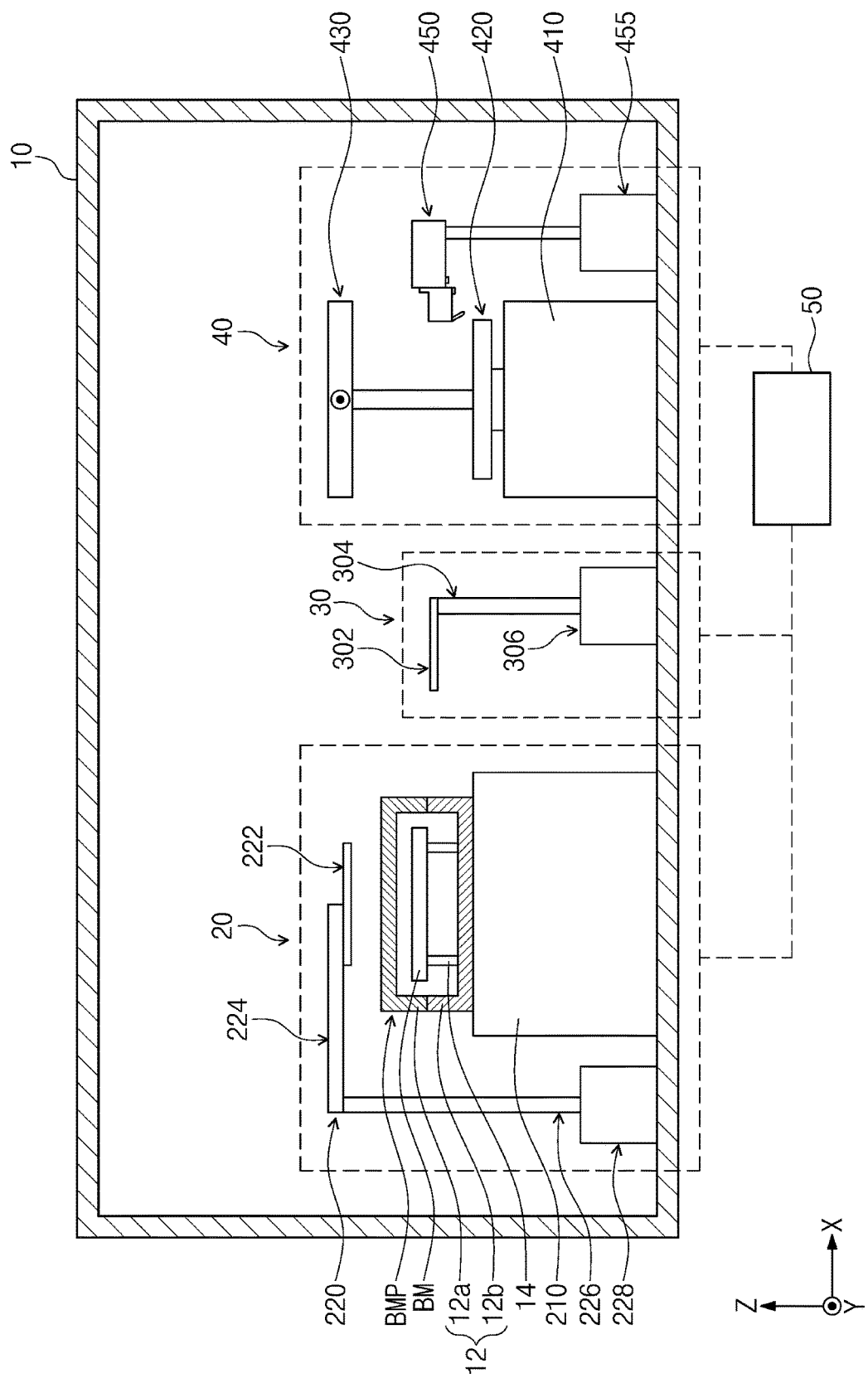
FIG. 1 shows a mask treating apparatus according to exemplary embodiments.

The semiconductor devices described herein may be part of an electronic device, such as a semiconductor memory chip or semiconductor logic chip, a stack of such chips, a semiconductor package including a package substrate and one or more semiconductor chips, a package-on-package device, or a semiconductor memory module, for example. In the case of memory, the semiconductor device may be part of a volatile or non-volatile memory. The systems and methods described herein may be used to form patterns on masks, which are then used in a photolithography process to form patterns on a wafer that may be packaged into a semiconductor package.

It will be understood that when an element is referred to as being "connected" or "coupled" to, or "on" another element, it can be directly connected or coupled to, or on the other element or intervening elements may be present. In contrast, when an element is referred to as being "directly connected," "directly coupled," in or "directly on" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a connection contact (i.e., touching) unless the context indicates otherwise.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

FIG. 1 shows a mask treating apparatus 1 according to exemplary embodiments. The mask treating apparatus 1 may include a process chamber 10, an unpacking unit 20, a transfer robot 30, a laser marking unit 40, and a controller 50.

The mask treating apparatus 1 may execute a process on a blank mask BM. The blank mask BM may refer to a mask that has not yet had an exposure pattern formed thereon and is formed of a material for producing a photomask used to manufacture semiconductor, TFT-LCD, color filter, and so forth. The blank mask BM may generally include a quartz substrate and at least one of metal and photoresist layers coated on the quartz substrate. A blank mask package BMP may be provided to house the blank mask BM, protecting the blank mask BM from contamination, and thus the blank mask BM may be transferred via the blank mask package BMP.

The blank mask package BMP may include a case 12 inside which the blank mask BM is disposed. For example, the case 12 may include a top housing 12a and a bottom housing 12b that are combined with each other to fully enclose the blank mask BM. The blank mask package BMP may include therein a supporting board 14 that supports the blank mask BM. The case 12 may protect the blank mask BM from external contamination. The blank mask package BMP disclosed herein is just an example, and its configuration and shape are not limited thereto.

The blank mask package BMP may be introduced into the process chamber 10. The blank mask package BMP may be unpacked in the process chamber 10 and then a process may be performed on the blank mask BM within the process chamber 10. The process may be a process that forms a fiducial mark on the blank mask BM. In some embodiments, the fiducial mark may include one or more fiducial marks that form the basis of reference or comparison. For example, the fiducial marks may serve as reference points from which the locations of defects on the blank mask BM can be calculated or determined. In this description, a first direction X is defined, a second direction Y is defined perpendicular to the first direction X, and a third direction Z is defined perpendicular to the first and second directions X and Y.

The unpacking unit 20 may be disposed in the process chamber 10. The unpacking unit 20 may include a first stage 210 and an unpacking member 220. The blank mask package BMP may be placed on the first stage 210, and the first stage 210 may support the blank mask package BMP. The unpacking member 220 may unpack the blank mask package BMP.

The unpacking member 220 may include an unpacking part 222, an arm 224, a first supporting axis 226, and a first driving part 228. The blank mask package BMP may be unpacked in partial combination with the unpacking part 222. For example, the unpacking part may be an adsorption device that adsorbs the top housing 12a to itself in order to open the blank mask package BMP. However, the shape and unpacking method of the unpacking part 222 are not limited thereto. The arm 224 may connect the unpacking part 222 to the first supporting axis 226. The first supporting axis 226 may have a rod shape whose longitudinal direction is provided in a vertical direction (i.e., the third direction Z). The first driving part 228 may drive the first supporting axis 226 to swing (e.g., rotate) and elevate. Alternatively, the first driving part 228 may drive the first supporting axis 226 to elevate and straightly move in a horizontal direction on an X-Y plane. For example, the first driving part 228 may include a motor and/or an actuator that control rotational movement or vertical and/or horizontal movement of the first supporting axis 226. The configuration and shape of the unpacking member 220 disclosed herein are not limited thereto but may be variously modified.

The transfer robot 30 may transfer the blank mask BM between the unpacking unit 20 and the laser marking unit 40. For example, when the blank mask package BMP is unpacked in the unpacking unit 20, the transfer robot 30 may unload the blank mask BM from the unpacking unit 20 and then load the blank mask BM into the laser marking unit 40.

The transfer robot 30 may include a gripper 302, a second supporting axis 304, and a second driving part 306. The gripper 302 may support and transfer the blank mask BM. The second supporting axis 304 may have a rod shape whose longitudinal direction is provided in the vertical direction. The second driving part 306 may drive the second supporting axis 304 to swing (e.g., rotate) and elevate. Alternatively, the second driving part 306 may drive the second supporting axis 304 to elevate and straightly move in the horizontal direction. For example, the second driving part 306 may include a motor and/or an actuator that control rotational movement or vertical and/or horizontal movement of the second supporting axis 304. The configuration and shape of the transfer robot 30 disclosed herein are not limited thereto but may be variously modified.

The laser marking unit 40 may include a second stage 410, the supporting member 420, a reversing member 430, and a laser marking member 450. The blank mask BM may be placed on the second stage 410.

Figure 2A:
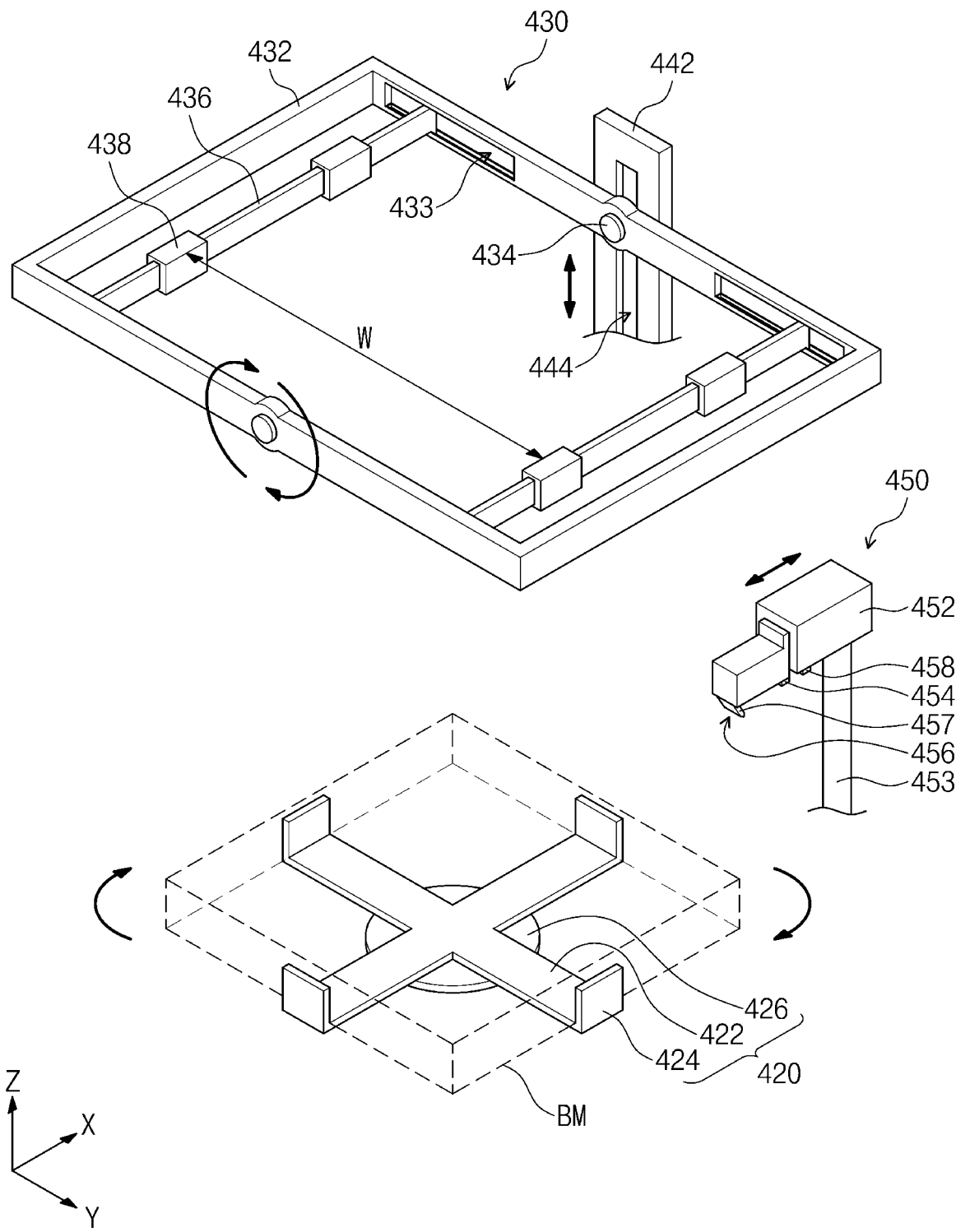
FIG. 2A is an enlarged view of a supporting member, a reversing member, and a laser marking member shown in FIG. 1.

FIG. 2A is an enlarged view of the example supporting member 420, the example reversing member 430, and the example laser marking member 450 shown in FIG. 1.

Referring to FIGS. 1 and 2A, the supporting member 420 may include a supporting part 422, a first fixing part 424, and a combining part 426. The supporting part 422 may be provided as a cross shape, having a flat top surface on which the blank mask BM can be placed. The supporting part 422 may be provided at each end with the first fixing part 424. The first fixing part 424 may vertically extend from the supporting part 422. As illustrated in FIG. 2A, the first fixing part 424 may include four first fixing parts 424, respectively provided at each of the four ends of a cross-shaped support part 422. The supporting part 422 may be provided to have the same width as that of the blank mask BM such that the first fixing part 424 may support a side surface of the blank mask BM. For example, each segment of the cross-shaped supporting part 422 may have a length that is the same as the width of the blank mask BM. The supporting part 422 may support and rotate the blank mask BM. For example, the supporting part 422 may rotate around a common central axis of the first fixing part 424 and the combining part 426. The combining part 426 may connect the supporting part 422 to the second stage 410.

The reversing member 430 may include a frame 432, a width-adjusting part 436, a second fixing part 438, and a vertical guide 442. The reversing member 430 may be disposed over the supporting member 420 in such a way that the reversing member 430 and the supporting member 420 may face each other. The frame 432 may be provided with first guide rails 433. For example, the frame 432 may have a rectangular shape with four linear sides, and the first guide rails 433 may be support bars or rods that are provided opposite one another on interior sides of the frame 432. The width-adjusting part 436 may be a solid mechanical component having a bar or cylinder shape, and be provided in a pair (e.g., two width-adjusting parts 436). Each width-adjusting part 436 may have opposite ends connected to corresponding first guide rails 433. The width-adjusting part 436 may move along the first guide rails 433 to adjust a width W between the pair of the width-adjusting parts 436. For example, the width-adjusting part 436 may be adjusted in its position to have the width W the same as that of the blank mask BM. The second fixing part 438 may be coupled to the width-adjusting part 436. The second fixing part 438 may place the blank mask BM in its fixed position. The second fixing part 438 may support a side surface of the blank mask BM. Each second fixing part 438 may have a shape that surrounds a portion of the width-adjusting part 436 (e.g., a hollow cylinder shape, a hollow barrel shape, or a hollow box-like shape).

The frame 432 may be coupled with the vertical guide 442. For example, the frame 432 may be engaged with the vertical guide 442 by a rotation axis 434, and may rotate around the rotation axis 434. The vertical guide 442 may connect the frame 432 with the supporting member 420. The vertical guide 442 may include a second rail 444 extending along the third direction Z.

Figure 2B:
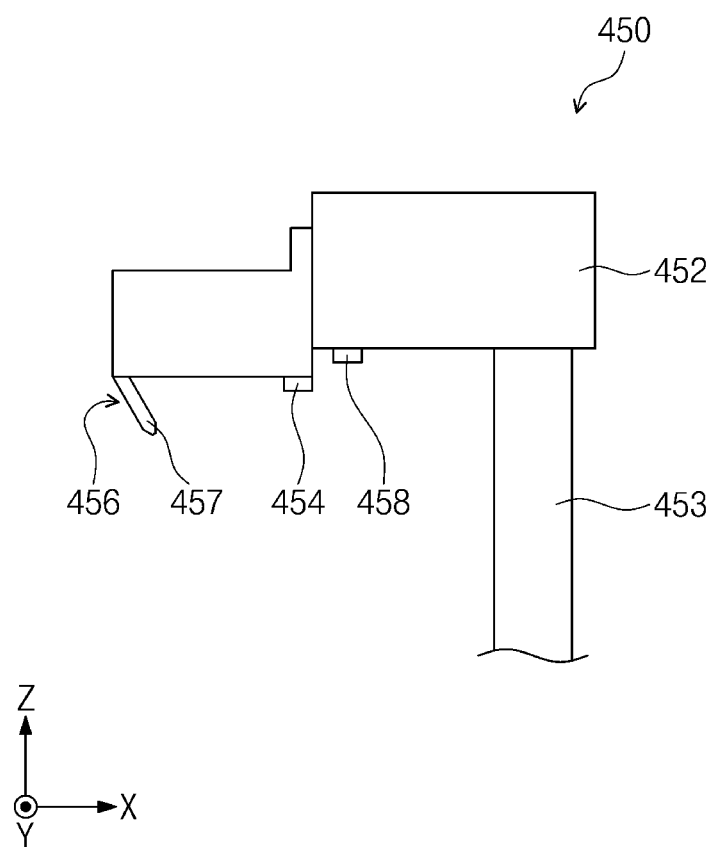
FIG. 2B is an enlarged view of a laser marking member shown in FIG. 1.

FIG. 2B is an enlarged view of the laser marking member 450 shown in FIGS. 1 and 2A. The laser marking member 450 illustrated herein is partially exaggerated and/or omitted for brevity of the drawing, and its dimensional ratio may be different from an actual ratio.

Referring to FIGS. 1, 2A, and 2B, the laser marking member 450 may include a body 452, a laser head 454, a cleaning gas supply 456, and an optical sensor 458. The laser marking member 450 may further include a third supporting axis 453 and a third driving part 455. The third supporting axis 453 may have a rod shape whose longitudinal direction is provided in the vertical direction. The third driving part 455 may drive the third supporting axis 453 to swing (e.g., rotate) and elevate. Alternatively, the third driving part 455 may drive the third supporting axis 453 to elevate and move in the horizontal direction.

The laser head 454 may be installed below the body 452. The laser head 454 may irradiate laser light onto the blank mask BM such that a fiducial mark (see FM of FIG. 4B) may be formed on the blank mask BM. The fiducial mark may serve as a criterion for informing defect positions on the blank mask BM. For example, one or more fiducial marks may be used as reference points from which the location of defects on the blank mask BM can be determined and avoided during subsequent mask fabrication. The fiducial mark may be formed by a laser having a wavelength of about 100 nm to about 700 nm generated from the laser head 454 at a power of about 100 mW to about 1000 mW. For example, the fiducial mark may be formed by a laser having a wavelength of about 350 nm generated from the laser head 454 at a low power of less than about 500 mW.

The cleaning gas supply 456 may be installed below the body 452. The blank mask BM may be positioned such that its center is disposed closer to the cleaning gas supply 456 than to the laser head 454. The cleaning gas supply 456 may include an injector 457 downward inclined toward the laser head 454. In this configuration, the injector 457 of the cleaning gas supply 456 may provide a cleaning gas to an edge of the blank mask BM. The injector 457 may be provided as a slit shape or, alternatively, as a plurality of injecting holes. Although not shown in the figures, the body 452 may be provided therein with a cleaning gas reservoir for storing the cleaning gas.

The cleaning gas supply 456 may supply the blank mask BM with the cleaning gas. For example, the cleaning gas supply 456 may be configured to supply the cleaning gas to the blank mask BM to prevent particle scattering. The cleaning gas supply 456 may include, for example, a gas supply head or nozzle to supply the cleaning gas to the blank mask BM. The cleaning gas may include, for example, a clean dry air or a nitrogen gas. The cleaning gas may be supplied, when the laser head 454 forms the fiducial mark on the blank mask BM, and may be sprayed toward the edge of the blank mask BM such that surface damage to the blank mask BM may be prevented. In this description, the cleaning gas supply 456 and the laser head 454 are exemplarily illustrated to engage with a single body 452. Alternatively, the cleaning gas supply 456 and the laser head 454 may be provided to have respective bodies.

The optical sensor 458 may be installed below the body 452. The blank mask BM may be positioned such that its center is disposed farther away from the optical sensor 458 than from the laser head 454. The optical sensor 458 may irradiate light onto the blank mask BM such that its surface may be automatically focused. For example, the optical sensor 458 may adjust a distance in the third direction Z from the blank mask BM to focus the surface of the blank mask BM on which the fiducial mark is formed. The optical sensor 458 may irradiate light onto the blank mask BM such that its edge may be sensed. The optical sensor 458 may sense the edge of the blank mask BM to establish an area on which the fiducial mark is formed. The configuration and shape of the laser marking member 450 disclosed herein are not limited thereto but may be variously modified.

The controller 50 may control the unpacking unit 20, the transfer robot 30, and the laser marking unit 40. The controller 50 may control operating time and sequence of the unpacking unit 20, the transfer robot 30, and the laser marking unit 40. The controller 50 may control the laser marking unit 40 to select a mark formation mode. The mark formation mode may include a first mode and a second mode. The mark formation mode will be discussed below in detail.

Figure 3:
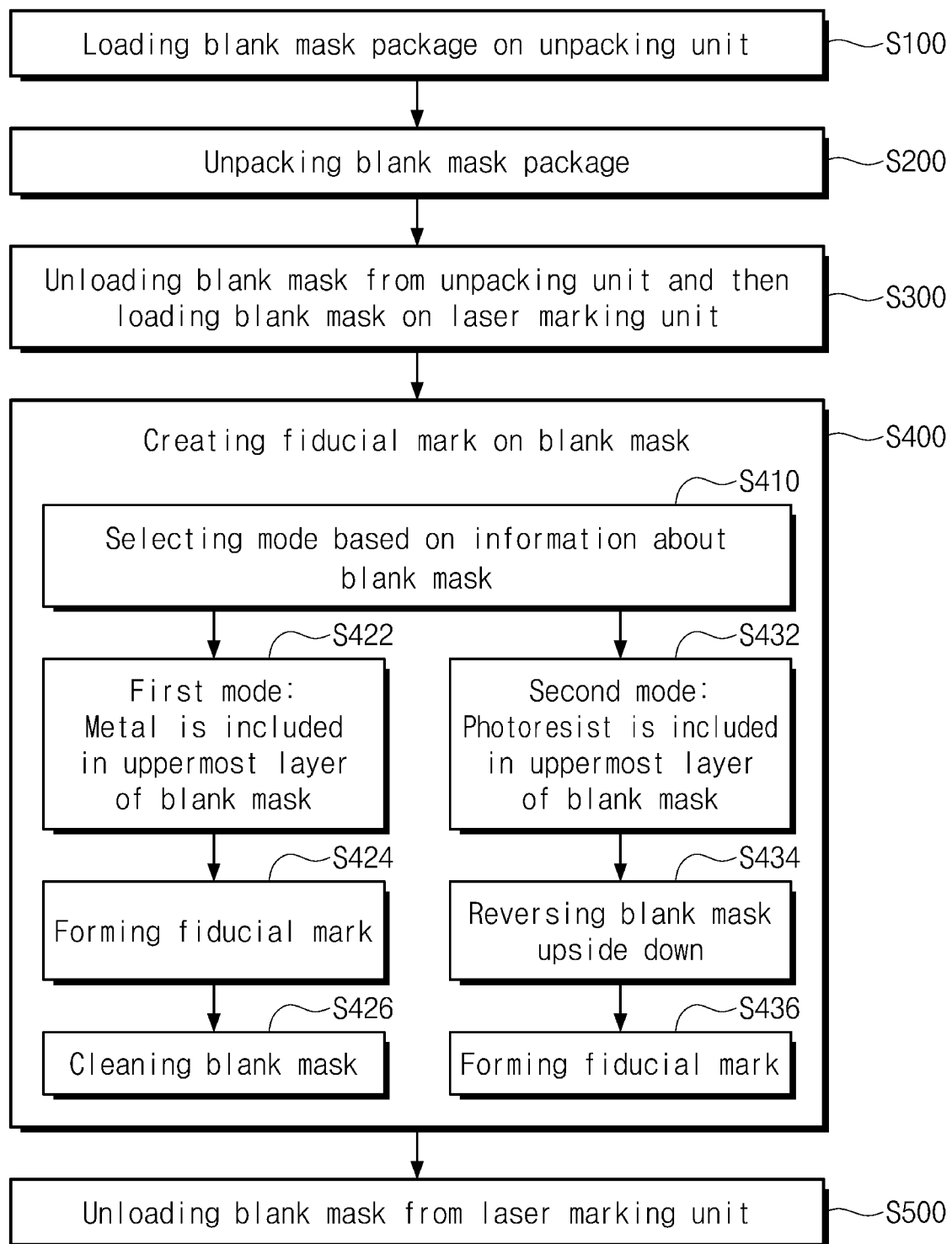
FIG. 3 is a flow chart illustrating a procedure of processing a blank mask executed by a mask treating apparatus according to exemplary embodiments.
Figure 4A:
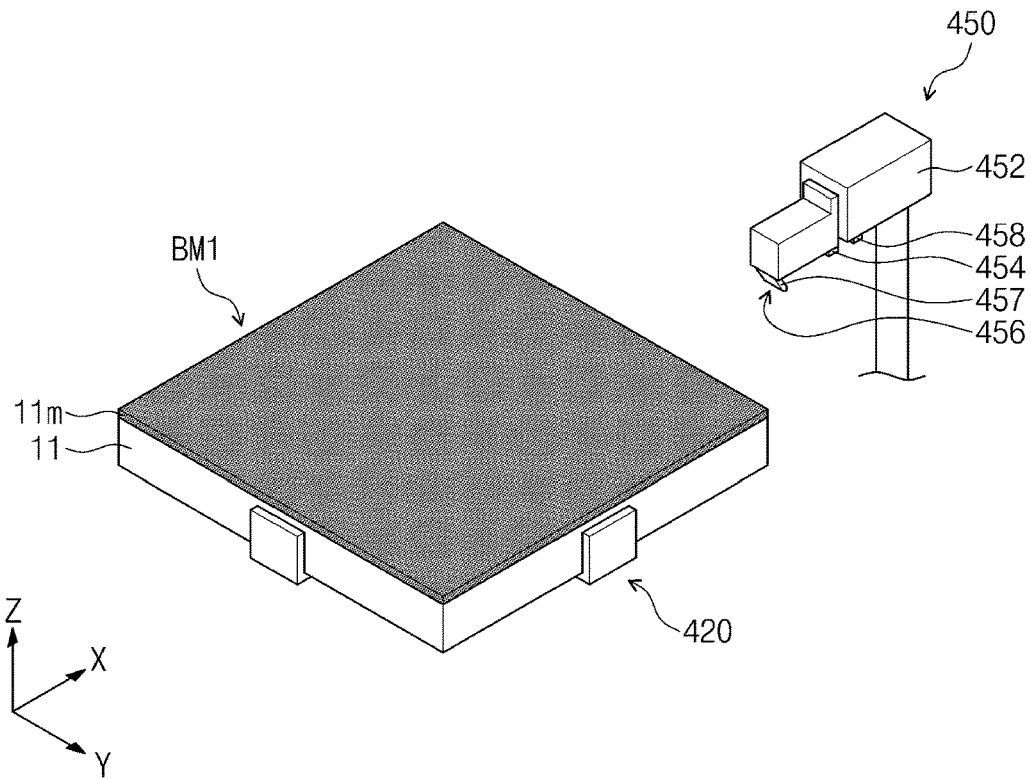
FIGS. 4A to 4C show forming a fiducial mark on a blank mask executed by a laser marking unit under an exemplary first mode.
Figure 4B:
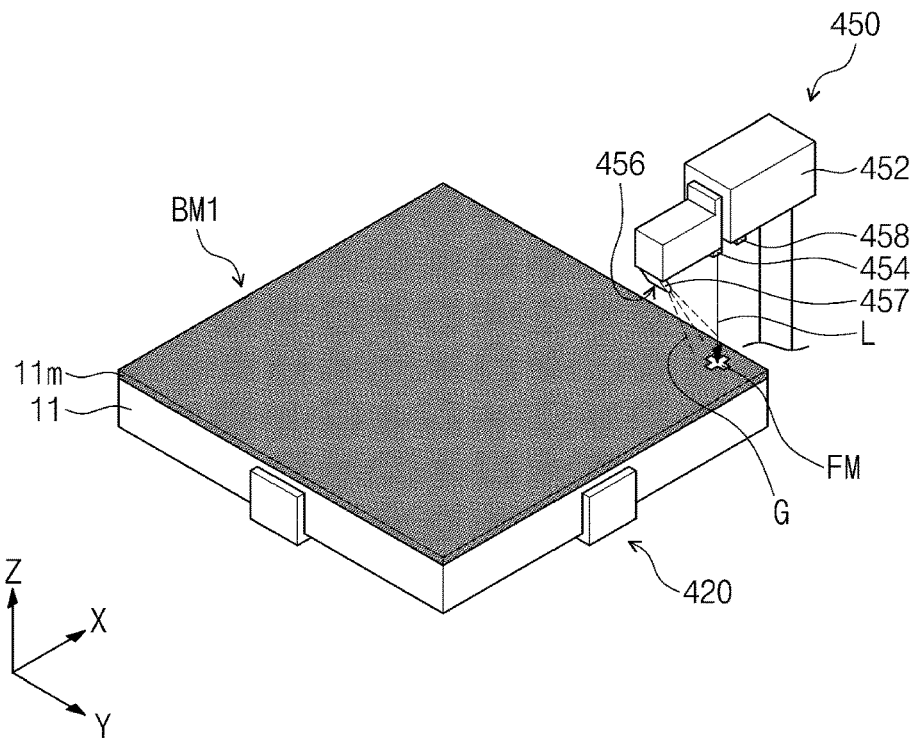
Figure 4C:
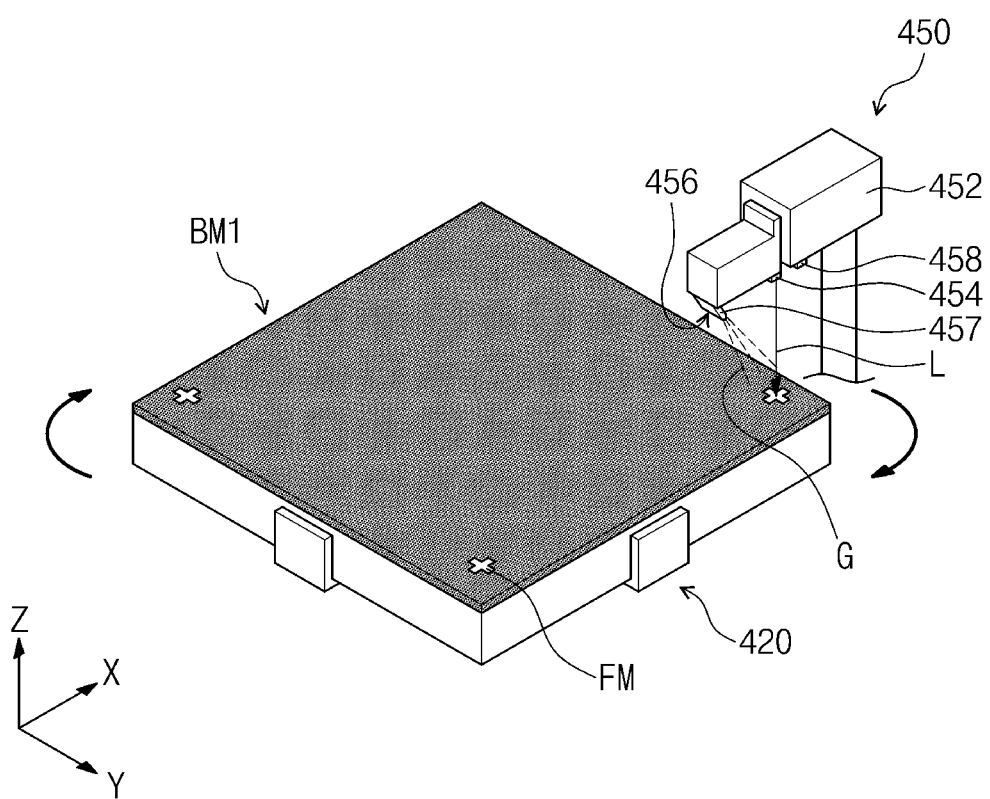

FIG. 3 is a flow chart illustrating a procedure of processing the blank mask BM executed by the mask treating apparatus 1 according to exemplary embodiments. FIGS. 4A to 4C show forming a fiducial mark on a blank mask BM1 executed by the laser marking unit 40 under the first mode. FIGS. 5A to 5E show forming a fiducial mark on a blank mask BM2 executed by the laser marking unit 40 under the second mode.

Referring to FIG. 3, the blank mask package BMP may be loaded on the unpacking unit 20 (S100). When the first stage 210 is provided thereon with the blank mask package BMP, the unpacking unit 20 may unpack the blank mask package BMP (S200). For example, the unpacking member 220 may open the top housing 12a of the blank mask package BMP. Thereafter, the transfer robot 30 may unload the blank mask BM from the unpacking unit 20 and then load the blank mask BM into the laser marking unit 40 (S300). The laser marking unit 40 may be provided with the blank mask BM.

The laser marking unit 40 may form a fiducial mark on the blank mask BM (S400). After the formation of the fiducial mark, the blank mask BM may be unloaded from the laser marking unit 40 (S500). The fiducial mark may serve as a criterion for securing defect positions on the blank mask BM. For example, the fiducial mark may be a reference point from which the location coordinates of defects on the blank mask BM can be determined. In some embodiments, the coordinates of the defects may be defined relative to the fiducial mark. For example, a defect may be identified as being located a certain distance away from the fiducial mark in the X and Y directions.

When creating the fiducial mark (S400), the controller 50 may select the mark formation mode based on information about the blank mask BM (S410). An external device may provide the controller 50 with the information about the blank mask BM. The information about the blank mask BM may include information about a constituent of an uppermost layer of the blank mask BM. In some embodiments, the uppermost layer may refer to an uppermost layer of a given side of the blank mask BM. For example, as discussed further below, an uppermost layer of a first side may include a metal, and an uppermost layer of a second side opposite the first side may include a photoresist.

Referring to FIGS. 3 and 4A, when metal is included in an uppermost layer of a blank mask BM1, the controller 50 may select the first mode (S422). For example, when chromium (Cr), molybdenum (Mo), or an EUV reflective layer is included in the uppermost layer of the blank mask BM1, the controller 50 may select the first mode. The blank mask BM1 may include a quartz substrate 11 and an overlying a metal layer 11m, which exemplarily includes CrON. Under the first mode, the controller 50 may cause the optical sensor 458 to irradiate light onto a top side of the blank mask BM1 loaded on the supporting member 420, and thus the formation location of the fiducial mark may be sensed.

Referring to FIGS. 3, 4B, and 4C, after sensing the formation location of the fiducial mark, the controller 50 may cause the laser head 454 to form a fiducial mark FM on the blank mask BM1 (S424). The laser head 454 may irradiate a laser light L onto the blank mask BM1 to form the fiducial mark FM on the metal layer 11m. The fiducial mark FM may serve as a criterion for informing defect positions on the blank mask BM1.

The controller 50 may control the cleaning gas supply 456 to supply the blank mask BM1 with a cleaning gas G (S426). The controller 50 may control the cleaning gas supply 456 and the laser head 454 such that the formation of the fiducial mark FM and the supply of the cleaning gas G may be performed at the same time. The cleaning gas G may include, for example, a clean dry air or a nitrogen gas. The injector 457 (also described as a gas supply head or a nozzle) of the cleaning gas supply 456 may be formed downward and inclined toward an edge of the blank mask BM1 such that the cleaning gas G may be sprayed onto the edge of the blank mask BM1 and thus the blank mask BM1 may be prevented from its surface damage. In addition, by positioning of the injector 457 at a downward, inclined angle, particles may be prevented from scattering and the laser head 454 may remain free of contamination. The controller 50 may rotate the supporting member 420, and thus another fiducial mark FM may further be formed on the edge of the blank mask BM1. For example, the controller 50 may cause the supporting member 420 to rotate 90°, and then the controller 50 may repeat the forming of the fiducial mark (S424) and cleaning of the blank mask BM (S426). These steps may be repeated until the fiducial mark FM has been formed at all four quadrants of the top side of the blank mask BM.

After that, the controller 50 may secure information about defect positions on the blank mask BM1 based on the fiducial mark FM on the blank mask BM1. For example, the controller 50 may determine the defect position in relation to the fiducial mark. The controller 50 may transmit the information about defect positions to an exposure apparatus and/or an inspection apparatus (not shown), and then a patterning process may be performed using the fiducial mark FM to align the blank mask BM1 and evade the defect positions. The controller 50 may secure again the information about defect positions after the blank mask BM1 is coated thereon with photoresist.

Figure 5A:
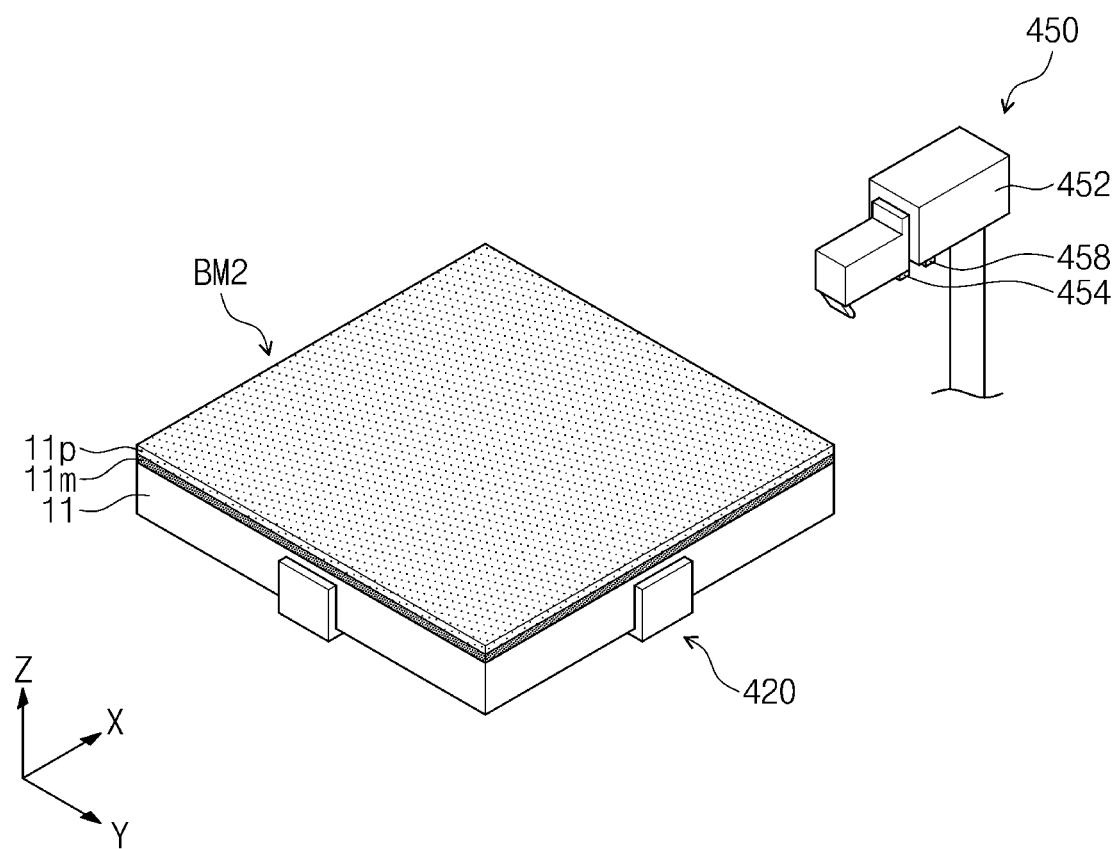
FIGS. 5A to 5E show forming a fiducial mark on a blank mask executed by a laser marking unit under an exemplary second mode.

Referring to FIGS. 3 and 5A, when photoresist is included in an uppermost layer of a blank mask BM2, the controller 50 may select the second mode (S432). The blank mask BM2 may include a quartz substrate 11, a photoresist layer 11p on the quartz substrate 11, and a metal layer 11m between the quartz substrate 11 and the photoresist layer 11p. Under the second mode, the controller 50 may control the optical sensor 458 to irradiate light onto a topside of the blank mask BM2 loaded on the supporting member 420, and thus a fiducial mark (see FM of FIG. 5D) may be sensed on its formation location.

Figure 5B:
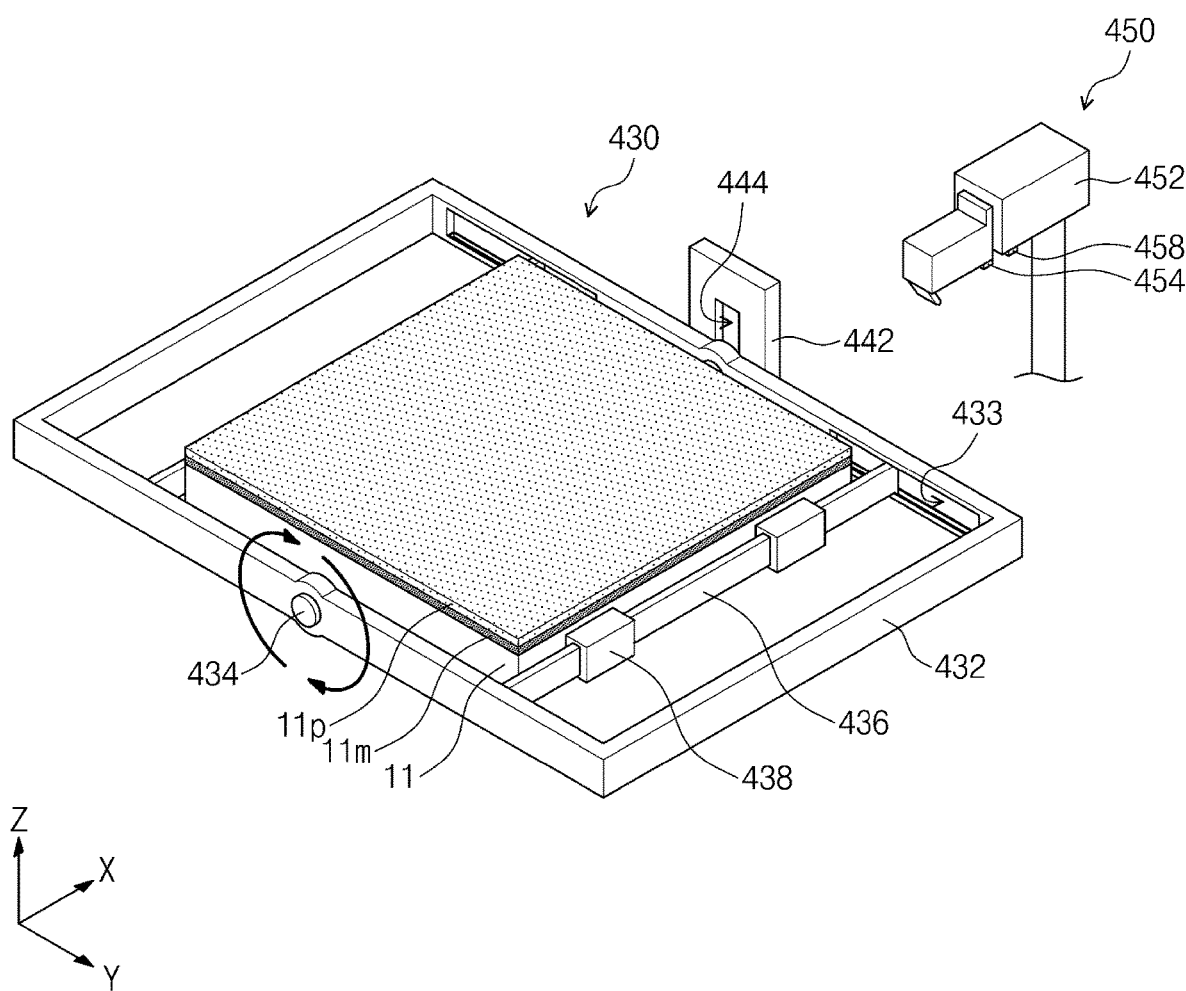
Figure 5C:
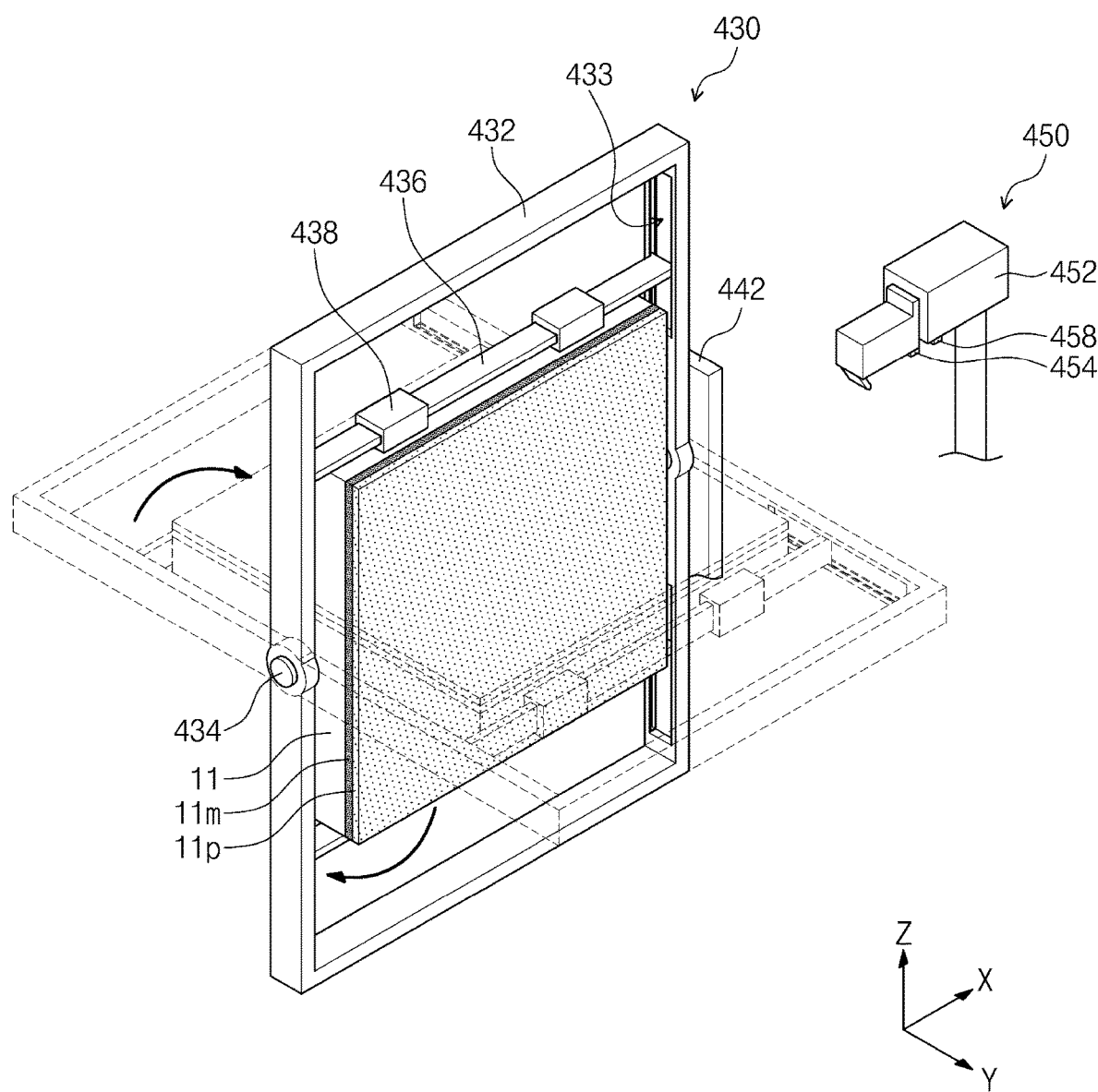

Referring to FIGS. 3, 5B, and 5C, after the fiducial mark is sensed, the controller 50 may control the reversing member 430 to reverse the blank mask BM2 upside down (S434). The blank mask BM2 may be reversed such that a bottom layer of the quartz substrate 11 may be exposed to face the laser marking member 450. The controller 50 may control the frame 432 such that the frame 432 may move along the vertical guide 442 and the width-adjusting part 436 may slide to conform to a width of the blank mask BM2, thereby allowing the second fixing part 438 to fix the blank mask BM2.

For example, the controller 50 may cause the frame 430 to elevate the blank mask BM2 above the supporting member 420, and instruct the reversing member 430 to rotate 180° around the rotation axis 434. Then, the controller 50 may cause the frame 430 to lower the blank mask BM2, returning the blank mask BM2 to the supporting member 420. The controller 50 may then cause the blank mask BM2 to be repositioned under the laser head 454.

Figure 5D:
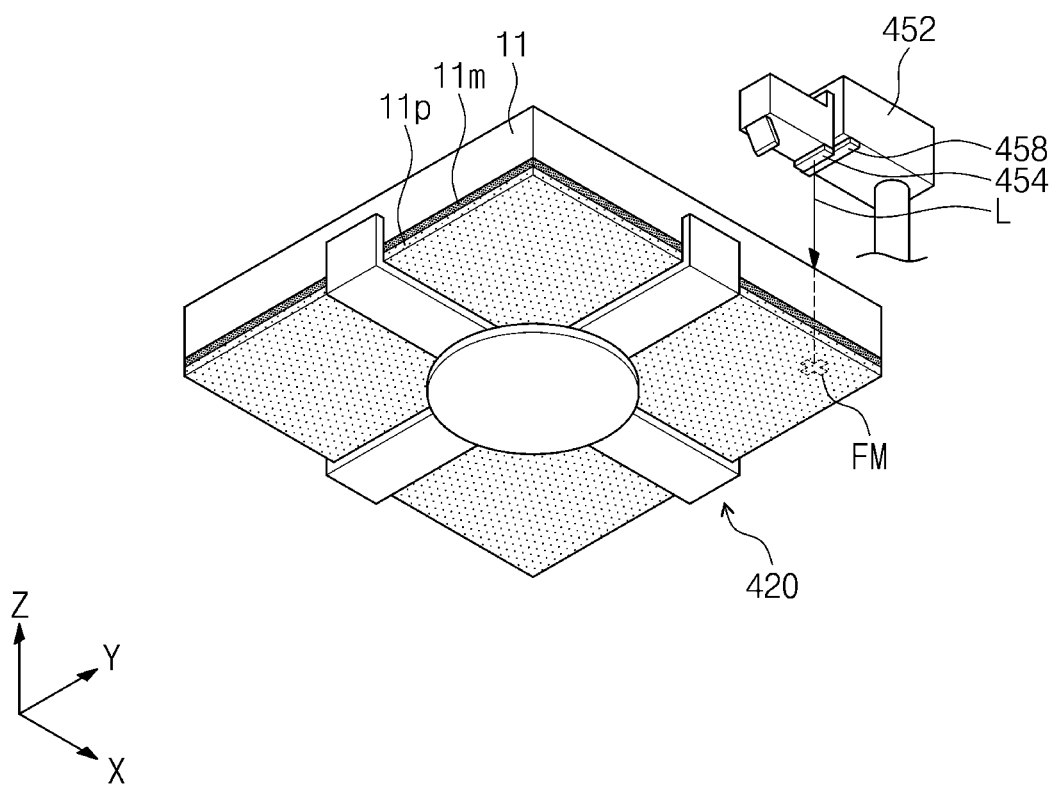
Figure 5E:
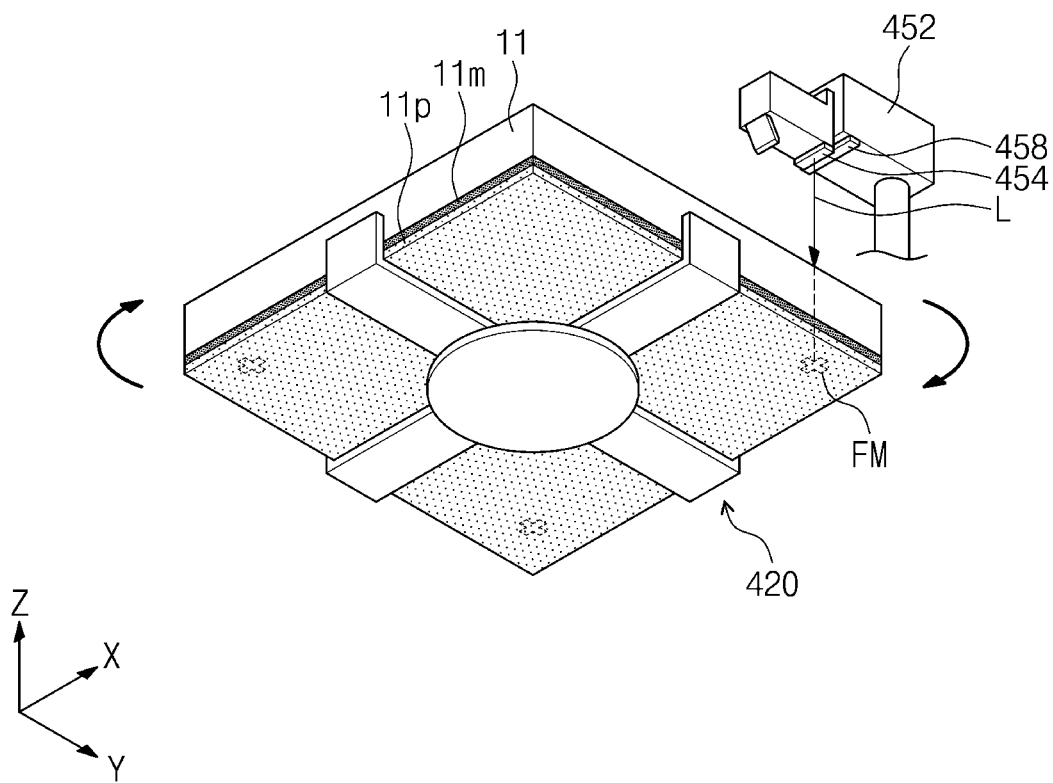

Referring to FIGS. 3, 5D, and 5E, after sensing the formation location of the fiducial mark, the controller 50 may cause the laser head 454 to form a fiducial mark FM on the blank mask BM2 (S436). The controller 50 may sense a formation location of the fiducial mark FM by irradiating light onto a backside of the blank mask BM2, i.e., the quartz substrate 11. When the controller 50 irradiates a laser light L onto the quartz substrate 11, the laser L may penetrate the quartz substrate 11 to form the fiducial mark FM on the metal layer 11m. As the laser L is not directly provided to the photoresist layer 11p, the photoresist layer 11p may be prevented from damage. The controller 50 may rotate the supporting member 420, and thus another fiducial mark FM may further be formed on the edge of the blank mask BM2.

Thereafter, the controller 50 may control the reversing member 430 to reverse the blank mask BM2 again, as described above, and secure information about defect positions based on the fiducial mark FM on the blank mask BM2.

For example, the controller 50 may determine the locations of the defect positions in relation to one or more fiducial marks. The controller 50 may transmit the information about defect positions (e.g., locations or coordinates) to an exposure apparatus and/or an inspection apparatus, and then a patterning process may be performed using the fiducial mark FM to align the blank mask BM2 and evade the defect positions.

As discussed herein, when a blank mask BM is stocked and unpacked from the unpacking machine, the fiducial marks are patterned on the metal layer with a laser marking machine and cleaned before coaling to secure the defect coordinates through the inspection of the metal layer, After the photoresist coating, the defect coordinates may be secured through the photoresist surface inspection process and the position and orientation between the two defect coordinates and the design pattern are analyzed to reflect the offset and rotation information that can avoid the defects as much as possible.

According to the present exemplary embodiments, a fiducial mark may be formed to identify defect positions on a blank mask. A laser marking unit may be provided in a blank mask package of an unpacking unit so that no separate process and/or facility may be required to form the fiducial mark. As an unpacking process on the blank mask package is an initial process for manufacturing a photomask, the fiducial mark may be formed using an existing process and/or facility. It may thus be possible to prevent increase in load and cost of mass production facility. In addition, as a laser marking can be performed on a metal layer included in the blank mask, the blank mask may be prevented from changing its surface characteristics. A cleaning gas may be provided to prevent the fiducial mark and the laser marking unit from contamination and debris.

Figure 6:
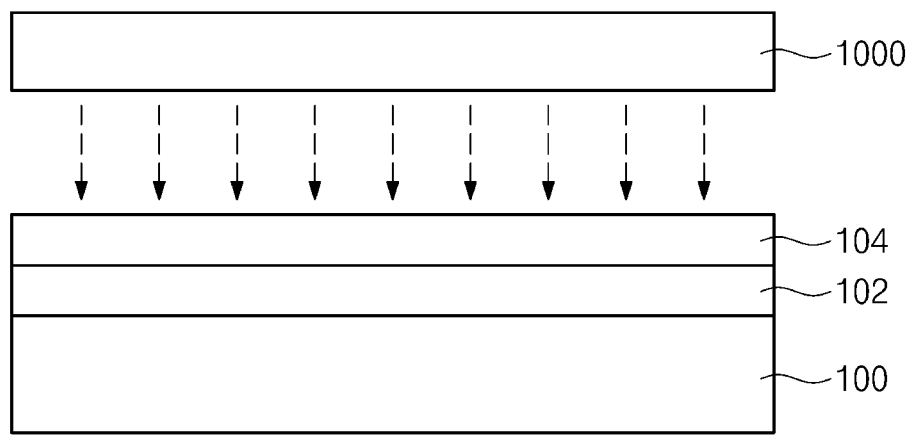
FIG. 6 is a cross-sectional view showing a process of fabricating a semiconductor device using a mask according to exemplary embodiments.

FIG. 6 is a cross-sectional view showing a process of fabricating a semiconductor device using a photomask.

Referring to FIGS. 4B and 6, a metal layer 11*m* of a blank mask BM1 may be correctly patterned by avoiding defect positions using a fiducial mark FM to form a photomask 1000 having a pattern. A semiconductor substrate 100 having an etch-target layer 102 and a photoresist layer 104 on the etch-target layer 102. Using the photomask 1000, a photolithography process is performed to form a photoresist pattern. Using the photoresist pattern, the etch-target layer 102 may be patterned.

Furthermore, as a laser is not directly provided to a photoresist layer, the photoresist layer may be prevented from damage and surface property change.

The effects of the exemplary embodiments are not limited to the aforementioned effects. Other effects, which are not mentioned above, will be apparently understood by one skilled in the art from the foregoing description and accompanying drawings.

These embodiments herein are presented to facilitate understanding of the disclosure and should not limit the scope thereof, and it is intended that the exemplary embodiments cover the various combinations, the modifications, and variations. The technical protection scope of the present disclosure will be defined by the technical spirit of the appended claims, and is intended to include all modifications and equivalent substantially falling within the spirit and scope of the disclosure while not being limited by literary descriptions in the appended claims.

What is claimed is:

1. A mask treating method comprising:
creating on a blank mask a fiducial mark serving as a reference point to determine a defect position on the blank mask,
wherein creating the fiducial mark comprises:
selecting one of a first mode and a second mode based on an uppermost layer of the blank mask;
irradiating a laser light onto a first side of the blank mask to form the fiducial mark under the first mode; and
reversing the blank mask upside down and then irradiating the laser light onto a second side of the blank mask to form the fiducial mark under the second mode.

2. The method of claim 1,
wherein the first mode is selected when metal is included in the uppermost layer, and
wherein the second mode is selected when photoresist is included in the uppermost layer.

3. The method of claim 2, further comprising:
providing a cleaning gas to perform a cleaning process on the blank mask under the first mode,
wherein the cleaning gas comprises a clean dry air or a nitrogen gas.

4. The method of claim 3,
wherein the fiducial mark is formed simultaneously with performing the cleaning process under the first mode, and
wherein the cleaning gas is provided downward inclined toward an edge of the blank mask.

5. The method of claim 1, further comprising:
aligning the blank mask based on a location of the fiducial mark;
determining the defect position on the blank mask in relation to the location of the fiducial mark; and
patterning the blank mask by evading the defect position.

6. The method of claim 1, further comprising:
providing a blank mask package that includes a blank mask; and
unpacking the blank mask package to provide the blank mask.

7. The method of claim 1,
wherein the blank mask comprises a quartz substrate and a metal layer on the quartz substrate, and
wherein the creating of the fiducial mark comprises creating the fiducial mark on the metal layer.

8. The method of claim 7,
wherein the blank mask further comprises a photoresist layer on the metal layer in the second mode, and
wherein the irradiating of the laser light comprises irradiating the laser light through the quartz substrate onto the metal layer.

9. The method of claim 8, wherein the laser light is not directly provided to the photoresist layer.

10. A mask treating method comprising:
providing a blank mask package that includes a blank mask;
unpacking the blank mask package to provide the blank mask; and
creating on the blank mask a fiducial mark serving as a reference point to determine a defect position on the blank mask,
wherein creating on the blank mask the fiducial mark comprises:
selecting one of a first mode and a second mode based on an uppermost layer of the blank mask;

irradiating a laser light onto a first side of the blank mask to form the fiducial mark under the first mode; and reversing the blank mask upside down and then irradiating the laser light onto a second side of the blank mask to form the fiducial mark under the second mode.

11. The method of claim 10,
wherein the first mode is selected when metal is included in the uppermost layer, and
wherein the second mode is selected when photoresist is included in the uppermost layer.

12. The method of claim 11, further comprising:
providing a cleaning gas to perform a cleaning process on the blank mask under the first mode,
wherein the cleaning gas comprises a clean dry air or a nitrogen gas.

13. The method of claim 12,
wherein the fiducial mark is formed simultaneously with performing the cleaning process under the first mode, and
wherein the cleaning gas is provided downward inclined toward an edge of the blank mask.

14. The method of claim 10, further comprising:
aligning the blank mask based on a location of the fiducial mark;
determining the defect position on the blank mask in relation to the location of the fiducial mark; and
patterning the blank mask by evading the defect position.

15. The method of claim 10,
wherein the blank mask comprises a quartz substrate and a metal layer on the quartz substrate, and
wherein the creating of the fiducial mark comprises creating the fiducial mark on the metal layer.

16. The method of claim 15,
wherein the blank mask further comprises a photoresist layer on the metal layer in the second mode, and
wherein irradiating of the laser light comprises irradiating the laser light through the quartz substrate onto the metal layer.

17. The method of claim 16, wherein the laser light is not directly provided to the photoresist layer.

18. A mask treating method comprising:
providing a blank mask package that includes a blank mask;
unpacking the blank mask package to provide the blank mask; and
creating a fiducial mark on the blank mask, the fiducial mark serving as a reference point to determine a defect position on the blank mask,
wherein the creating the fiducial mark comprises selecting one of a first mode and a second mode based on an uppermost layer of the blank mask,
wherein the first mode is selected when metal is included in the uppermost layer, and
wherein the second mode is selected when photoresist or quartz substrate is included in the uppermost layer.

19. The method of claim 18, wherein the creating the fiducial mark further comprises:
irradiating a laser light onto a first side of the blank mask to form the fiducial mark under the first mode; and
reversing the blank mask upside down and then irradiating the laser light onto a second side of the blank mask to form the fiducial mark under the second mode.

* * * * *